United States Patent
Smith et al.

(10) Patent No.: US 8,674,744 B2
(45) Date of Patent: Mar. 18, 2014

(54) ELECTRONIC DEVICE AND METHOD FOR PROVIDING A DIGITAL SIGNAL AT A LEVEL SHIFTER OUTPUT

(75) Inventors: Nigel P. Smith, Munich (DE); Byoung-Suk Kim, Munich (DE); Stefan Reithmaier, Vilsheim (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/289,867

(22) Filed: Nov. 4, 2011

(65) Prior Publication Data

US 2013/0113540 A1    May 9, 2013

(51) Int. Cl.
*H03L 5/00* (2006.01)
(52) U.S. Cl.
USPC .............................. 327/333; 327/108; 326/81
(58) Field of Classification Search
USPC ........ 327/108, 112, 170, 333; 326/68, 80–83; 365/189.11
See application file for complete search history.

(56) References Cited

U.S. PATENT DOCUMENTS 6,603,334 B1 * 8/2003 Takahashi ..................... 327/108

* cited by examiner

*Primary Examiner* — Long Nguyen
(74) *Attorney, Agent, or Firm* — William B. Kempler; Wade J. Brady, III; Frederick J. Telecky, Jr.

(57) ABSTRACT

An electronic device comprising a level shifter and a method. The level shifter includes an input adapted to receive an input signal switching between a low input voltage level and a high input voltage level and a first switch and a second switch coupled in series between a low output voltage supply and a high output voltage supply. An output is coupled to an interconnection node between the first and the second switch and is adapted to be coupled to a load. The first and second switches are controlled by the input signal. The level shifter further includes a third switch which is coupled between the interconnection node and an auxiliary voltage supply which has a voltage level between the low output voltage level and the high output voltage level.

10 Claims, 2 Drawing Sheets

ELECTRONIC DEVICE AND METHOD FOR PROVIDING A DIGITAL SIGNAL AT A LEVEL SHIFTER OUTPUT

FIELD OF THE INVENTION

The invention relates to a method for providing a digital signal at a level shifter output.

BACKGROUND OF THE INVENTION

Level shifters are frequently used for shifting the low and high levels of a digital signal output from one part of a system to different low and high levels required by another part of the same system.

FIG. 1 and FIG. 2 both show the concept of a level shifter receiving a digital input signal 2 with logic levels of, for example, a controller. The level shifter has an output 4 at which positive and negative drive signals of an appropriate level are output to a distributed load 6 which is shown in a simplified way in FIG. 2.

FIG. 3 shows the principle of operation of an output stage of a level shifter according to the prior art. Two switches S1 and S2 are connected in series between a first voltage supply providing a voltage $V_L$ according to a low level of a digital signal to be output from the level shifter and a second voltage supply providing a voltage $V_H$ according to a high level of the digital signal. An interconnection node between switches S1 and S2 is coupled via an output of the level shifter to a resistive-capacitive load represented by a resistor RLOAD and a capacitor CLOAD. Switches S1 and S2 are controlled by the digital signal input to the level shifter and only one of the switches is closed at a time.

Switches S1 and S2 are often implemented by MOSFET devices, but also by bipolar transistors or JFETs. Other electronically controllable switches may of course be used as well.

While e.g. MOS field effect transistors provide a very low ON resistance thus approaching an ideal switch, they function as current sources or current sinks during switching until the voltage on the output has risen high enough to render the voltage across the MOSFET quite small, at which point they behave like low-value resistors. Thus, when switching, there is a period during which a significant voltage drop across the active MOSFET device occurs, while a current is flowing through it. This results in power dissipation in the device.

One of the technical fields in which level shifters are required is the field of Liquid Crystal Displays (LCD). Level shifters must here transform the logic levels of the control signals of a timing controller providing, for example, a difference between low and high voltage level of less than 5 V into positive and negative drive signals of an appropriate level which depends on a particular LCD display and can reach several tens of volts. Present-generation LCDs using amorphous silicon gates (ASG), also called Gate-in-Panel (GIP) or Gate-On-Array (GOA) need drive voltages between about 20 V to 40 V for the high level and between about −5 V to −20 V for the low level resulting in a voltage difference from 25 V up to 60 V.

In an LCD application, the level shifter must drive a distributed resistive capacitive load as shown in FIG. 1 which may be simplified to the circuit shown in FIG. 2.

Because of the capacitive nature of the load connected to its output, power dissipation in the level shifter varies with the magnitude of the low and high levels of the drive voltage, the switching frequency, and the values of the resistance and the capacitance of the load. Especially, total system power dissipation depends on the voltage difference between the low and high levels of the drive voltage, whereas power dissipation in the level shifter depends on the external resistance and the characteristics of the non-ideal switches used in the level shifter. If the value of the external resistor in the load is large, the MOS field effect transistor approximates an ideal switch. However, with a small resistive load as usual in LCD displays, the MOS field effect transistor behaves as mentioned above as a current source or a current sink during a large part of the switching period. High power dissipation leads to an increased temperature. If the temperature exceeds the display manufacturer's internal design rules, additional thermal management is required which increases costs.

Furthermore, a lower temperature improves the reliability of the level shifter and allows a higher integration. Additionally, reduced power dissipation reduces the power needed to be generated by the bias functions of the LCD, i.e. by the power supply for the level shifter. Thus, also the power supply is improved concerning reliability and possibility of integration.

With level shifters having a plurality of outputs, a so-called "charge-sharing" solution is known. In systems using charge-sharing, panel display columns are first driven alternately at voltage levels above and below the required voltage level by using e.g. inverters. Or in other words, always two neighboring columns are driven as out-of-phase pairs, with a duty cycle of exactly 50%. In the charge-sharing period, dedicated switches are closed which interconnect all columns allowing current to flow from the columns with a voltage above the voltage level to the columns with a voltage below the voltage level.

SUMMARY OF THE INVENTION

It is a general object of the invention to minimize power dissipation in a level shifter even having only one output. The power dissipation can be reduced without having to preserve an exact duty cycle.

In one aspect of the invention a level shifter is provided with a first switch and a second switch coupled in series between a low output voltage supply and a high output voltage supply and with an output coupled to an interconnection node between the first switch and the second switch and adapted to be coupled to a load. The level shifter has a third switch which is coupled between the interconnection node and an auxiliary voltage supply which has a voltage level between the low output voltage level and the high output voltage level. Thus, the level shifter is configured to bias the level shifter signal output with an intermediate voltage $V_x$ having a level between the low output voltage level $V_L$ and the high output voltage level $V_H$ of the output signal.

Biasing the signal output to an intermediate voltage $V_x$ reduces the voltage drop across the active MOSFET device. Instead of having a voltage step of $V_H-V_L$, there is only a voltage step of $V_H-V_x$, respectively $V_x-V_L$. Instead of having one voltage step, there are two steps.

In an embodiment, the switches are configured to switch in a switching sequence from the second switch to the third switch to the first switch, wherein each of the switches is consecutively closed. Only one switch is closed at the same time. Thus, intermediate biasing is only effectuated when switching from the low output voltage level to the high output voltage level.

In an embodiment, the intermediate step of switching the signal output to the auxiliary voltage supply is also performed when switching the signal output from the high output voltage supply to the low output voltage supply.

The switches can then be configured to switch in a switching sequence from the first switch to the third switch to the second switch. The switches are consecutively closed and only one switch is closed at a time. Therefore, intermediate biasing is effectuated when switching from the high output voltage level to the low output voltage level.

The previous two aspects can be combined. The switches can be configured to switch in a switching sequence from the second switch to the third switch to the first switch and then again to the third switch and to the second switch. The switches are consecutively closed and only one switch is closed at a time. Therefore, intermediate biasing is effectuated when switching from the low output voltage level to the high output voltage level and vice versa.

In other words, the first, second and third switches are controlled such that only one switch is closed at a time with a switching sequence from the first switch to the third switch to the second switch being consecutively closed and wherein this sequence is repeated and reversed, according to the polarity of the output transition.

In an embodiment, the auxiliary voltage supply is configured to be able to sink and to source current. Thus, a current discharging the capacitive load might be sunk as well as a current might be sourced by the auxiliary voltage supply to charge the capacitances.

In an embodiment, the auxiliary voltage supply provides an intermediate voltage $V_x$ with $V_x=(V_H+V_L)/2$. Thus, the two voltage steps in which the voltage is switched, i.e. $V_H-V_x$ and $V_x-V_L$ are equal and the voltage drops across the non-ideal switches are minimized. More exactly, equal voltage steps lead to minimized voltage drops only when the characteristics of the first and the second switches are identical. If they have different behavior during switching, the voltage steps may be adapted to this behavior in order to minimize the voltage drops.

The level shifter can be integrated in an electronic device which is used in an LCD application and the digital signal is a clock signal.

The invention further provides a method for providing a digital signal having a low output voltage level and a high output voltage level at a signal output of a level shifter. Accordingly, the signal output is switched to a low output voltage supply providing a voltage $V_L$ with the low output voltage level. The signal output is then switched to an auxiliary supply voltage level providing a voltage $V_x$ with an intermediate voltage level between the low output voltage level and the high output voltage level. The signal output is then switched to a high output supply voltage level providing a voltage $V_H$.

The voltage level $V_x$ of the auxiliary voltage supply can be about $(V_H+V_L)/2$.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENTS

Figure 4:
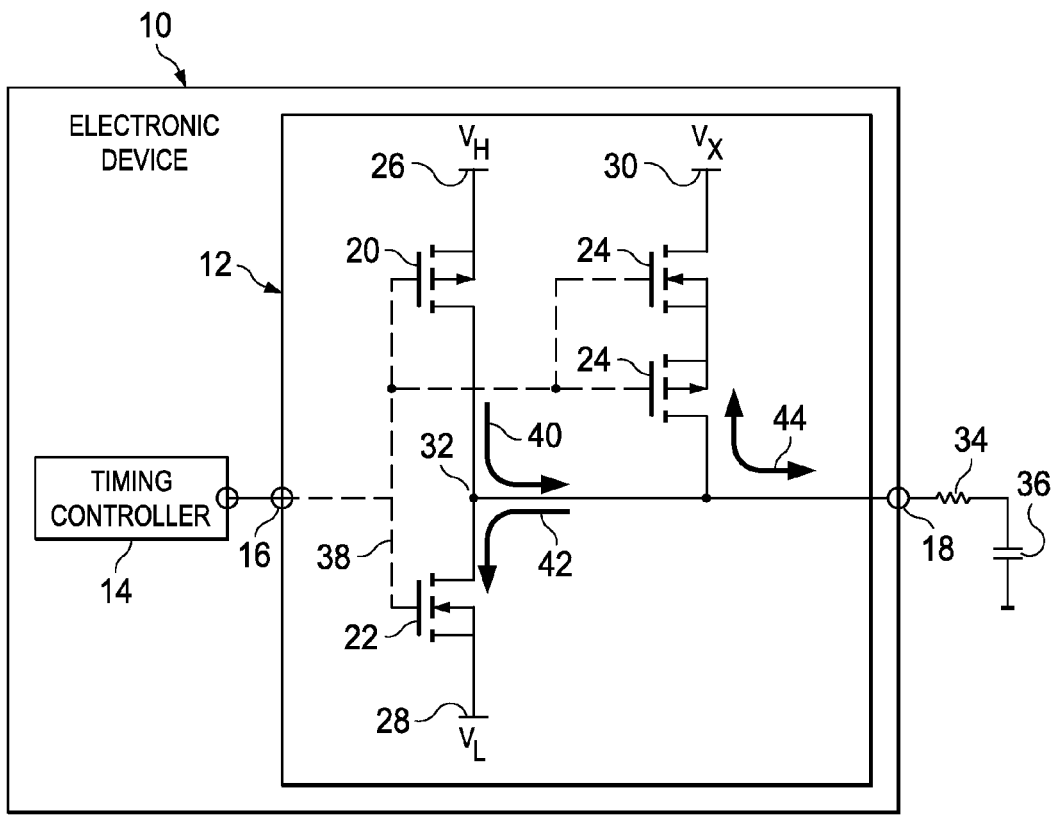
FIG. 4 is a simplified block diagram of an embodiment of an electronic device according to the invention.

FIG. 4 is a simplified block diagram of an electronic device according to aspects of the invention. The electronic device 10 comprises a level shifter 12 and a timing controller 14. Timing controller 14 may not be included in electronic device 10. Level shifter 12 has a signal input 16 for receiving a digital signal with a low input voltage level and a high input voltage level and a signal output 18 for providing the digital signal with a low output voltage level and a high output voltage level. The digital signal may be a clock signal.

Level shifter 12 comprises a first switch 20, a second switch 22 and a third switch 24. The switches may be realized by MOS-FETs as shown in FIG. 4, but other switches known by the person skilled in the art can be used.

First switch 20 is coupled to a high output voltage supply 26 providing a voltage $V_H$ having the high output voltage level and to second switch 22. Second switch 22 is further coupled to a low output voltage supply 28 providing a voltage $V_L$ having the low output voltage level. An interconnection node 32 between first switch 20 and second switch 22 is coupled to signal output 18. Voltage $V_L$ is usually comprised between about –5 V and about –20 V in an LCD application using a Gate-In-Panel technology. Voltage $V_H$ is usually comprised between about 20 V and about 40 V in an LCD application using a Gate-In-Panel technology. Of course, the level shifter according to aspects of the invention may be used for other technologies with other voltages.

Generally, the low input voltage level and the high input voltage level can be any standard logic level and the low and high output voltage levels are dependent on the LCD technology with which the level shifter is used.

Third switch 24 which is realized by two MOS-FETs is coupled to an auxiliary voltage supply 30 providing a voltage $V_x$ with an intermediate voltage level and to the interconnection node 32 which is coupled to signal output 18. Thus, auxiliary voltage supply 30 provides the possibility to pre-bias signal output 18.

A distributed resistive-capacitive load is coupled to signal output 18. The load may be an LCD application. The distributed resistive-capacitive load is shown simplified comprising a resistor 34 and a capacitor 36.

The level shifter with pre-bias is especially advantageous if the voltage difference between the high output voltage level and the low output voltage level is important and if the load is capacitive with a small or even very small resistance. Voltage Vx is set to be between $V_L$ and $V_H$. Power dissipation is minimized when voltage $V_x$ is $(V_H+V_L)/2$ in case that switches 20 and 22 have the same characteristics as explained above. Auxiliary voltage supply 30 is configured to be able to sink and to source current.

In operation, timing controller 14 outputs a digital signal changing between the low input voltage level and the high input voltage level which is input to signal input 16 of level shifter 12. The difference between the low input voltage level and the high input voltage level depends on the technology used but is usually about 3.3 V. The digital signal is used to control switches 20, 22 and 24 as indicated in FIG. 4 by dashed lines 38. When the input digital signal is high, first switch 20 is closed and switches 22 and 24 are open, thus, signal output 18 is forced to $V_H$. With the input digital signal low, second switch 22 is closed and switches 20 and 24 are open, thus, signal output 18 is forced to $V_L$. When a rising or a falling slope is detected in the input digital signal, third switch 24 is closed and switches 20 and 22 are open, thus, signal output 18 is forced to $V_x$. Thus, the level shifter is configured to shift the digital signal from a low input voltage level and a high input voltage level at the signal input to a low output voltage level and a high output voltage level at the signal output.

In an implementation, a falling or rising edge in the input signal is detected and the electronic device is adapted to close third switch 24 upon detection of an edge for a predetermined time.

In another implementation, passing of determined voltage thresholds is detected and the electronic device is adapted to close and to open third switch 24 upon detection.

Only one switch closed (connecting) at a time and the other two switches are open (disconnecting). A typical switching sequence is: third switch 24 closed—first switch 20 closed—third switch 24 closed—second switch 22 closed—third switch 24 closed—first switch 20 closed—third switch 24 closed . . . and so on.

Arrows 40, 42 and 44 indicate the directions of current flow. With first switch 20 closed, high output voltage supply 26 sources current as indicated by arrow 40 and the capacitive load 36 is charged. With second switch 22 closed, low output voltage supply 28 sinks current as indicated by arrow 42 and the capacitive load 36 is discharged. With third switch 24 closed because of a falling slope, auxiliary voltage supply 30 sinks currents, whereas auxiliary voltage supply 30 sources current, if third switch 24 is closed because of a rising slope.

The amount of charging or discharging current is defined by the characteristics of the active switch. With a small external load resistor the first switch, i.e. the MOSFET 20 always behaves as a current source, the second switch, i.e. MOSFET 22 always behaves as a current sink, and the third switch, i.e. MOSFET 24, behaves as a current source during low-to-high transitions and as a current sink during high-to-low transitions. As the voltage at signal output 18 is first forced to the intermediate voltage $V_x$ before changing to the high (or the low) level, the voltage drop across each current source/sink is reduced and thus power dissipation in the level shifter is reduced.

Figure 1:
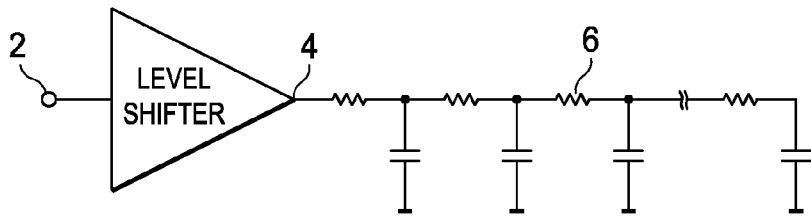
FIG. 1 is a schematic of a distributed resistive-capacitive load of a level shifter.
Figure 2:
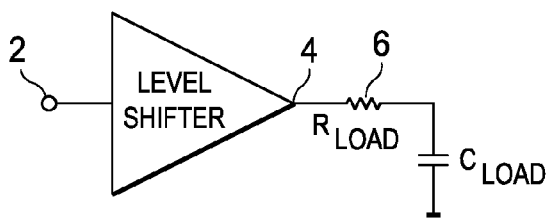
FIG. 2 is a simplified schematic of the resistive-capacitive load of FIG. 1.
Figure 3:
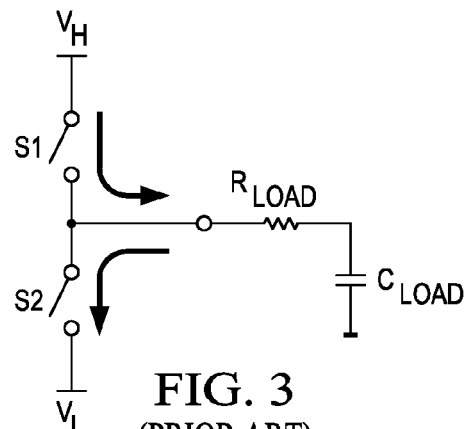
FIG. 3 shows the principle of operation of a level shifter according to the state of the art.
Figure 5:
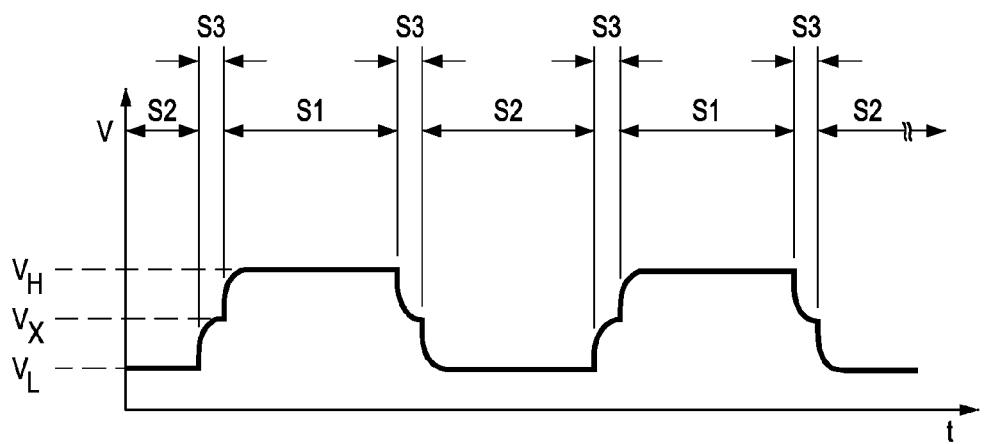
FIG. 5 shows a digital signal at a signal output of level shifter according to the invention.

FIG. 5 shows in a voltage-over-time diagram a typical output waveform at signal output 18. Above the waveform is indicated whether first switch S1, second switch S2 or third switch S3 is closed. At first, second switch 22 is closed and signal output 18 is forced to $V_L$. Then, third switch 24 is closed and signal output 18 is forced to $V_x$. When $V_x$ is reached or a predefined time period has elapsed, first switch 20 is closed and signal output 18 is forced to $V_H$. When a falling edge is detected in the input digital signal, third switch 24 is closed and signal output 18 is again forced to $V_x$. When $V_x$ is reached or a predefined time period has elapsed, second switch 22 is closed and signal output 18 is forced to $V_L$. Switching continues as shown.

For maximum power saving, $V_x$ should be exactly midway between $V_H$ and $V_L$ for identical switches. However, the invention works with any voltage $V_x$ between $V_H$ and $V_L$ albeit with reduced benefit the further $V_x$ is away from its ideal value because then one of the voltage differences $V_H$-$V_x$ and $V_x$-$V_L$ increases leading to an increased power dissipation.

Auxiliary voltage $V_x$ can be supplied by a regulated voltage such as an LCD bias supply voltage or a source driver supply voltage which are usually in the range of 40% to 60% of $V_H$-$V_L$.

Figure 6:
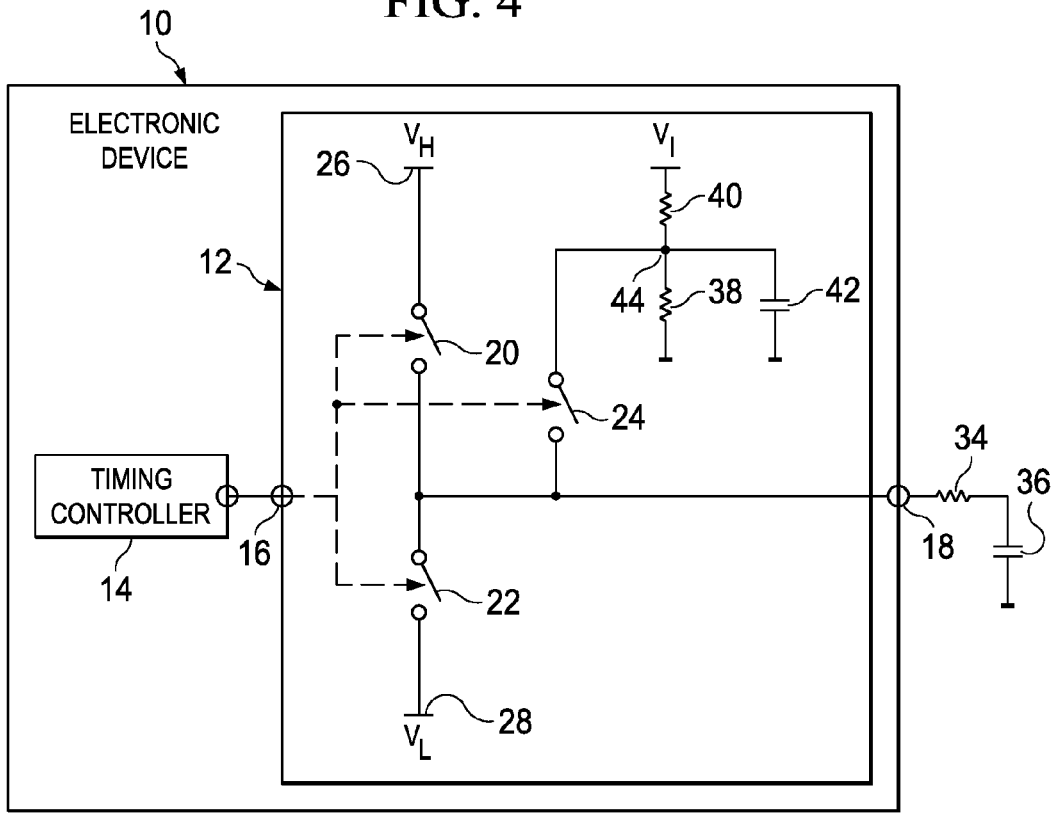
FIG. 6 is a simplified block diagram of a further embodiment of an electronic device according to the invention.

FIG. 6 shows an alternative embodiment of the electronic device 10 comprising a level shifter 12 and a timing controller 14. Timing controller 14 may also be separate. The same reference signs as in FIG. 4 are used for the same components. Level shifter 12 in FIG. 6 further comprises a resistor 38 coupled between ground and third switch 24, a resistor 40 coupled between third switch 24 and a voltage supply $V_1$ and a capacitor 42 coupled between ground and an interconnection node 44 between third switch 24, resistor 38 and resistor 40. $V_1$ is any suitable regulated voltage available to the electronic device. The intermediate voltage $V_x$ for pre-biasing signal output 18 is thus provided by a resistive divider formed by resistors 38 and 40. This is possible, since the DC current, i.e. the net or average current flowing into and output of the $V_x$ terminal is very small and approaches zero in the ideal case.

Although the invention has been described in detail, it should be understood that various changes, substitutions and alterations can be made thereto without departing from the spirit and scope of the invention as defined by the appended claims.

The invention claimed is:

1. A level shifter comprising
    an input adapted to receive an input signal switching between a low input voltage level and a high input voltage level;
    a first switch and a second switch coupled in series between a low output voltage supply and a high output voltage supply, wherein the first and second switches are controlled by the input signal;
    an output coupled to an interconnection node between the first and the second switch and adapted to be coupled to a load;
    a third switch which is coupled between the interconnection node and an auxiliary voltage supply; and
    the auxiliary voltage supply has a voltage level between the low output voltage level and the high output voltage level, wherein the first, second and third switches are controlled such that only one switch is closed at a time with a switching sequence from the first switch to the third switch to the second switch being consecutively closed and wherein this sequence is repeated and reversed, according to the polarity of the output transition.

2. The level shifter according to claim 1, wherein the auxiliary voltage supply is configured to be able to sink and to source current.

3. An electronic device comprising a level shifter according to claim 1.

4. An electronic device comprising a level shifter according to claim 2.

5. The electronic device according to claim 3, wherein the electronic device is used in an LCD application and the input signal is a clock signal.

6. The electronic device according to claim 4, wherein the electronic device is used in an LCD application and the input signal is a clock signal.

7. A method for providing a digital signal having a low output voltage level and a high output voltage level at a signal output of a level shifter, the method comprising:
    switching the signal output to a low output voltage supply providing a voltage with the low output voltage level;
    switching the signal output to an auxiliary voltage supply providing a voltage with an intermediate voltage level between the low output voltage level and the high output voltage level;
    switching the signal output to a high output voltage supply providing a voltage with the high output voltage level, wherein the steps are performed in sequence and only one of the switching steps is performed at a time.

8. The method according to claim 7, wherein the step of switching the signal output to the auxiliary voltage supply is also effectuated when switching the signal output from the high output voltage supply to the low output voltage supply.

9. The method of claim 7, further comprising:
    switching the signal output to the auxiliary voltage supply; and
    switching the signal output to the high output voltage supply.

10. In an LCD application receiving control signals at a low voltage to be converted into control signals required to operate the LCD application, a level shifter comprising:
  an input adapted to receive an input signal switching between a low input voltage level and a high input voltage level;
  a first switch and a second switch coupled in series between a low output voltage supply and a high output voltage supply, wherein the first and second switches are controlled by the input signal;
  an output coupled to an interconnection node between the first and the second switch and adapted to be coupled to the LCD;
  a third switch which is coupled between the interconnection node and an auxiliary voltage supply; and
  the auxiliary voltage supply has a voltage level between the low output voltage level and the high output voltage level, wherein the first, second and third switches are controlled such that only one switch is closed at a time with a switching sequence from the first switch to the third switch to the second switch being consecutively closed and wherein this sequence is repeated and reversed, according to the polarity of the output transition.

* * * * *